(12) United States Patent
Lien et al.

(10) Patent No.: US 6,301,696 B1
(45) Date of Patent: Oct. 9, 2001

(54) FINAL DESIGN METHOD OF A PROGRAMMABLE LOGIC DEVICE THAT IS BASED ON AN INITIAL DESIGN THAT CONSISTS OF A PARTIAL UNDERLYING PHYSICAL TEMPLATE

(75) Inventors: Jung-Cheun Lien; Eddy Chieh Huang; Chung-yuan Sun, all of San Jose; Sheng Feng, Cupertino, all of CA (US)

(73) Assignee: Actel Corporation, Sunnyvale, CA (US)

( * ) Notice: Subject to any disclaimer, the term of this patent is extended or adjusted under 35 U.S.C. 154(b) by 0 days.

(21) Appl. No.: 09/281,008

(22) Filed: Mar. 30, 1999

(51) Int. Cl.[7] ........................................ G06F 17/50
(52) U.S. Cl. ........................ 716/16; 716/17; 716/2; 326/39; 326/41; 326/47
(58) Field of Search ........................ 716/2, 16, 17; 326/38, 39, 41, 47

(56) References Cited

U.S. PATENT DOCUMENTS

| | | | |
|---|---|---|---|
| 4,908,528 | | 3/1990 | Huang ........................... 326/24 |
| 5,621,650 | * | 4/1997 | Agrawal et al. .................. 716/16 |
| 5,644,496 | * | 7/1997 | Agrawal et al. .................. 716/17 |
| 5,768,479 | * | 6/1998 | Gadelkarim et al. ............. 706/52 |
| 5,805,496 | | 9/1998 | Batson et al. ................... 365/154 |
| 5,809,281 | | 9/1998 | Steele et al. .................... 211/170 |
| 5,818,750 | | 10/1998 | Manning ........................ 365/154 |
| 5,982,193 | * | 11/1999 | Agrawal et al. .................. 326/39 |
| 5,984,510 | * | 11/1999 | Guruswamy et al. ............ 716/2 |
| 5,990,702 | * | 11/1999 | Agrawal et al. .................. 326/41 |
| 6,034,544 | * | 3/2000 | Agrawal et al. .................. 326/39 |
| 6,107,823 | * | 8/2000 | Agrawal et al. .................. 326/41 |
| 6,195,774 | * | 2/2001 | Jacobson ....................... 714/727 |

* cited by examiner

*Primary Examiner*—Matthew Smith
*Assistant Examiner*—Jibreel Speight
(74) *Attorney, Agent, or Firm*—McCutchen, Doyle, Brown & Enersen, LLP

(57) ABSTRACT

A method of making an integrated circuit (IC) includes establishing an initial design for a field-programmable gate array (FPGA) to be included in the IC that includes programmable connections that can be programmed to implement a desired function; establishing an underlying physical template for the IC wherein at least a portion of the template is based on the initial design for the FPGA; selecting a specific configuration of the programmable connections in the FPGA; performing a manufacturing process of the IC using the underlying physical template, and, during the manufacturing process of the IC, bypassing selected on-state transistors in the FPGA used to implement the specific configuration of the programmable connections with metal connections while conserving the underlying physical template. An IC includes a semiconductor substrate and an FPGA fabricated on the semiconductor substrate. The FPGA has a final design that is based on an initial design contemplated by at least a portion of an underlying physical template used for making the IC. The initial design includes programmable connections that can be programmed to implement a desired function and the final design implements a specific configuration of the programmable connections of the initial design. The FPGA includes a plurality of transistors configured to implement the programmable connections of the initial design, and metal connections configured to bypass selected ones of the plurality of transistors as part of implementing the final design.

20 Claims, 17 Drawing Sheets

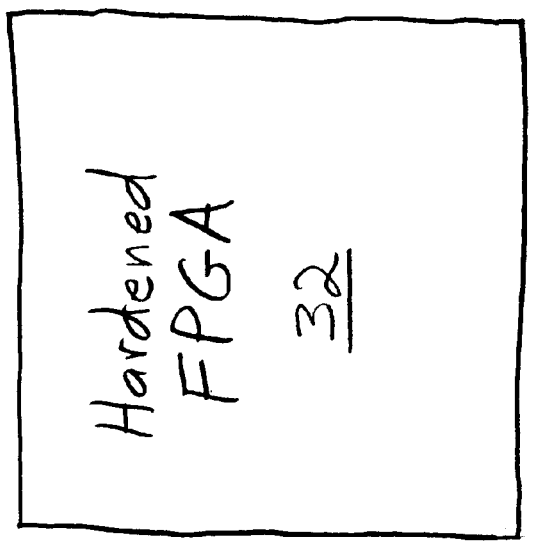
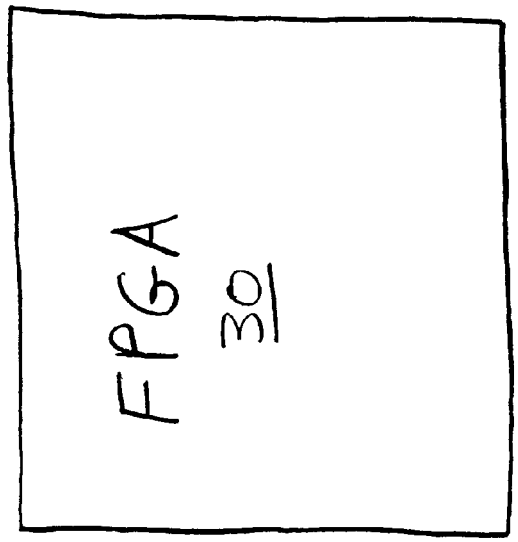
FIG. 2

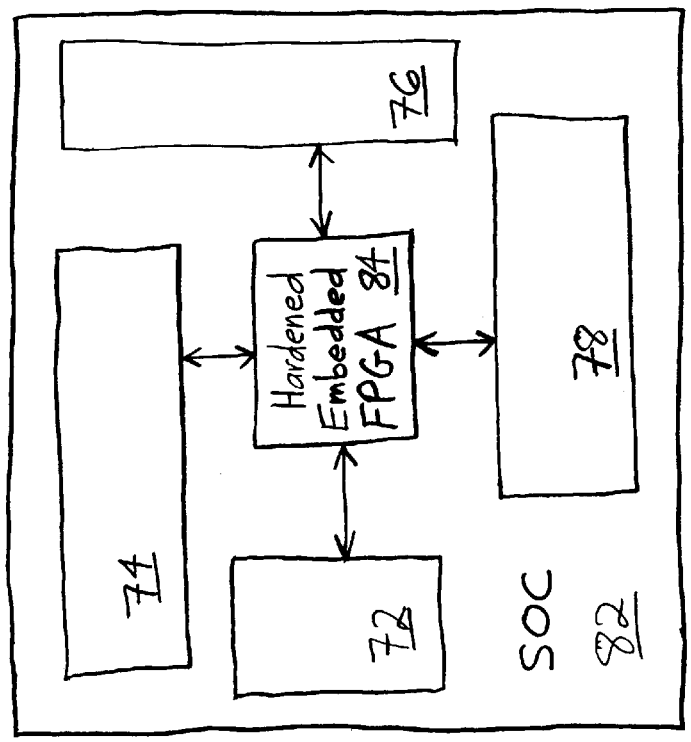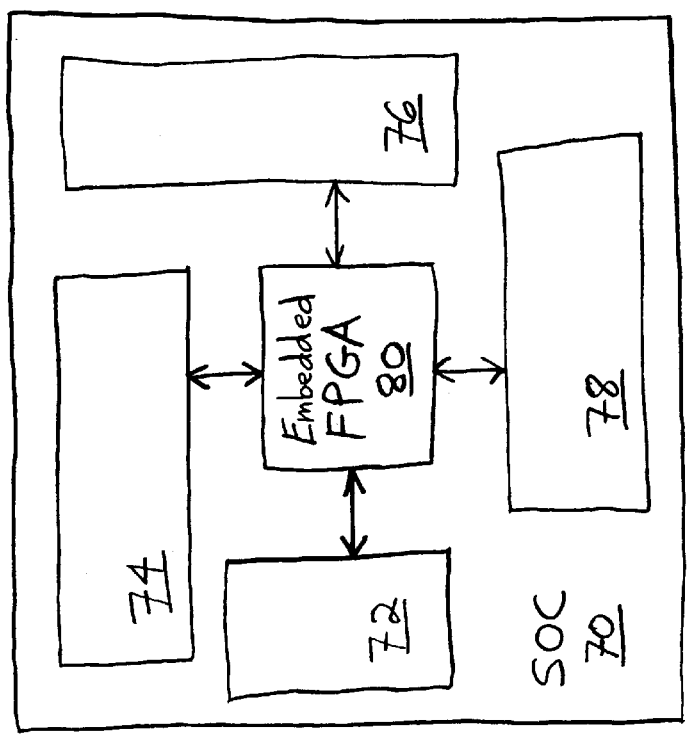
FIG. 5

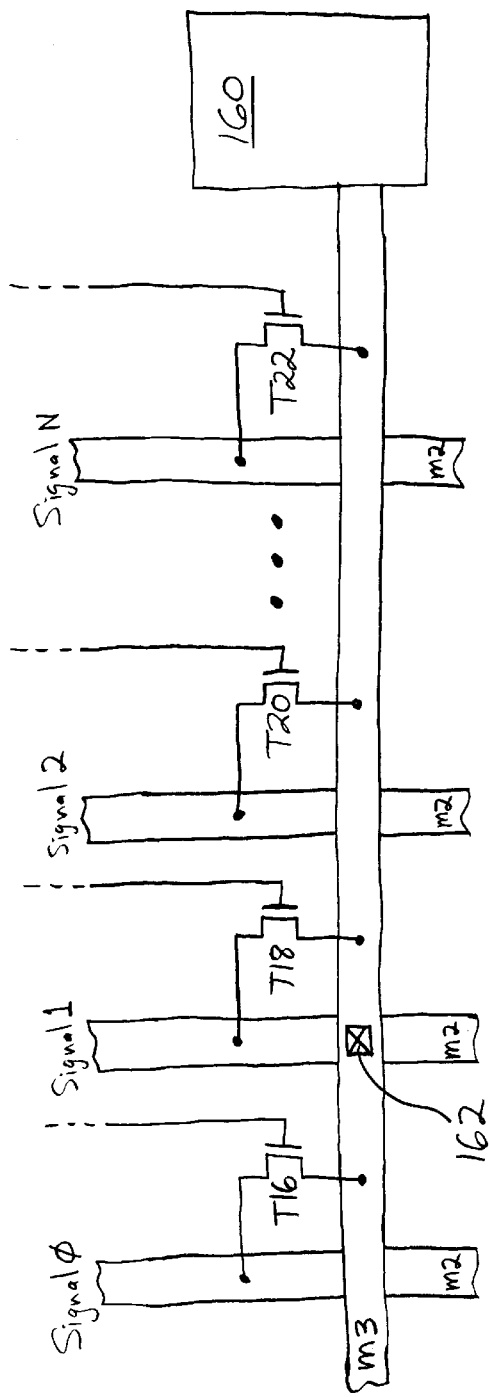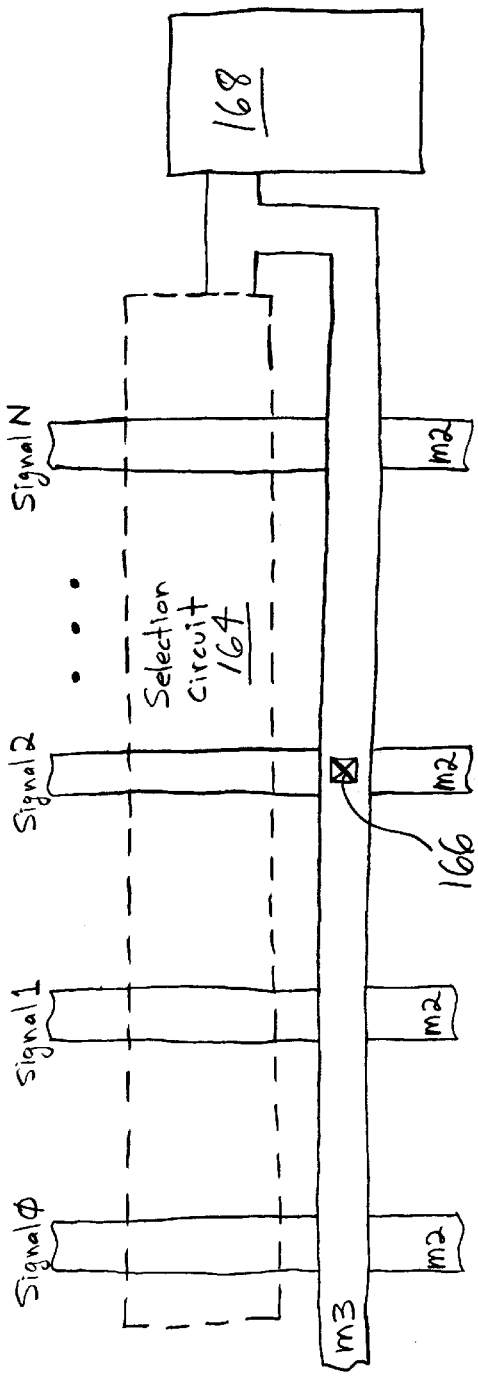
FIG. 10
FIG. 11

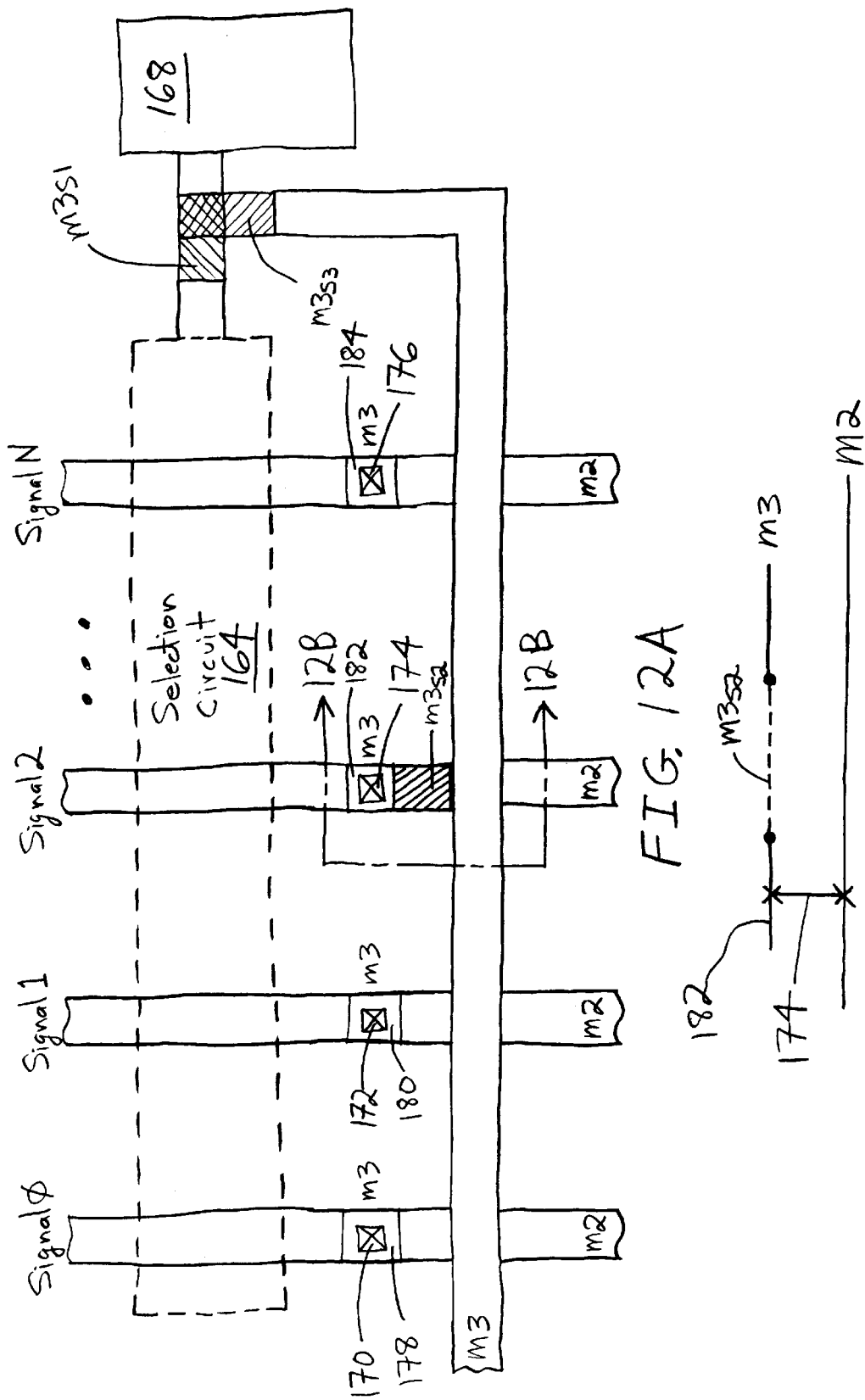

FINAL DESIGN METHOD OF A PROGRAMMABLE LOGIC DEVICE THAT IS BASED ON AN INITIAL DESIGN THAT CONSISTS OF A PARTIAL UNDERLYING PHYSICAL TEMPLATE

BACKGROUND OF THE INVENTION

1. Field of the Invention

The present invention relates to programmable logic devices, and more particularly, to a method and apparatus for increasing the speed of such devices.

2. Description of the Related Art

An excellent discussion of programmable logic devices (PLDs) can be found in Chapter Two of the textbook entitled "Computer Architecture and Organization" by John P. Hayes (McGraw-Hill, 3rd Edition, 1998). As stated therein, PLDs are integrated circuits (ICs) that contain many gates or other general-purpose cells whose interconnections can be configured or "programmed" to implement any desired combinational or sequential function. Two techniques are used to program PLDs: mask programming, which requires a few special steps in the IC chip-manufacturing process, and field programming, which is done by designers or end users "in the field" via small, low-cost programming units. Some field-programmable PLDs are erasable, implying that the same IC can be reprogrammed many times. This technology is especially convenient when developing and debugging a prototype design for a new product.

The connections leading to and from logic elements in a PLD contain transistor switches that can be programmed to be switched on or switched off. These switches are laid out in two-dimensional arrays so that large gates can be implemented with minimum IC area. These arrays of switches are known as programmable logic arrays (PLAs).

A field-programmable gate array (FPGA) is a two-dimensional array of general-purpose logic circuits, called cells or logic blocks, whose functions are programmable. The cells are linked to one another by programmable buses. The cell types are not restricted to gates. The cell types may be small multifunction circuits (or configurable functional blocks) capable of realizing all Boolean functions of a few variables. For example, configurable functional blocks typically include memory cells and connection transistors that may be used to configure logic functions such as addition, subtraction, etc., inside of the FPGA. A cell may also contain one or two flip-flops. Two types of logic cells found in FPGAs are those based on multiplexers and those based on programmable read only memory (PROM) table-lookup memories. Like all field programmable devices, FPGAs are suitable for implementing prototype designs and for small-scale manufacture.

FPGAs can store the program that determines the circuit to be implemented in a RAM or PROM on the FPGA chip. The pattern of the data in this configuration memory CM determines the cells' functions and their interconnection wiring. Each bit of CM controls a transistor switch in the target circuit that can select some cell function or make (or break) some connection. By replacing the contents of CM, designers can make design changes or correct design errors. The CM can be downloaded from an external source or stored on-chip. This type of FPGA can be reprogrammed repeatedly, which significantly reduces development and manufacturing costs. Some FPGAs employ fuses or antifuses as switches, which means that each FPGA IC can be programed only once. These one-time programmable FPGAs have other advantages, however, such as higher density, and smaller or more predictable delays.

Thus, as can be gathered from Mr. Hayes' textbook, PLDs and FPGAs are flexible devices that can be configured to implement many different functions.

Examining FPGAs in more detail, there is typically included a physical template that includes an array of circuits, sets of uncommitted routing interconnects, and sets of user programmable switches associated with both the circuits and the routing interconnects. Thus, an FPGA includes many programmable switches or connections that include programmable interconnections or routing interconnects of the FPGA array, as well as switches or connections within circuits or devices included within the FPGA. When these switches are properly programmed (set to on or off states), the template or the underlying circuit and interconnect of the FPGA is customized or configured to perform specific customized functions. By reprogramming the on-off states of these switches, an FPGA can perform many different functions. Thus, the ability to program these switches provides for a very flexible device.

These switches can be implemented in various technologies, such as ONO antifuse, M—M antifuse, SRAM memory cell, Flash EPROM memory cell, and EEPROM memory cell. In a memory cell controlled switch implementation, an NMOS transistor is typically used as the switch to either connect or disconnect two selected points (A, B) in the circuit. The NMOS' source and drain nodes are connected to points A, B respectively, and its gate node is directly or indirectly connected to the memory cell. By setting the state of the memory cell to either logical "1" or "0", the switch can be turned on or off and thus point A and B are either connected or disconnected.

Referring to FIG. 1, there is illustrated an FPGA 20 and an application specific integrated circuit (ASIC) 22. Assume that the FPGA 20 has been configured to perform one specific function, and assume that the ASIC 22 has been designed and manufactured to perform that same specific function. Because the FPGA 20 is a very flexible device that is capable of implementing many different functions, it is necessarily a larger device than the ASIC 22. This is because the FPGA 20, as a flexible device, includes a large amount of excess circuitry that is not being used to perform the one specific function and that excess circuitry has been eliminated in the design of the ASIC 22. Furthermore., the FPGA 20 is most likely a slower device and consumes more power than the ASIC 22. This is because many of the circuit connections within the FPGA 20 are provided by transistors, whereas those same circuit connections in the ASIC 22 are hard-wired connections. The transistor connections, even when the transistors are turned on, provides more resistance than a hard-wired connection. This results in slower speed with greater power consumption. The ASIC 22, on the other hand, is not a flexible device. In other words, once the ASIC 22 has been designed and manufactured it cannot be reconfigured to perform a different function like the FPGA 20 can.

Once a specific configuration for the FPGA 20 (or other PLD) has been decided upon, it would appear that replacing the FPGA 20 with the ASIC 22 would be the most efficient thing to do. But even though the ASIC 22 provides a smaller and faster implementation of the one specific function than the FPGA 20, the manufacture of the ASIC 22 requires the circuitry to be substantially redesigned. This redesigning becomes substantially more complex if the ASIC 22 is to be embedded in a larger IC. Such redesigning takes time and resources to perform, and consequently, slows down the manufacturing process and increases the cost of the device.

Thus, once a specific configuration of an FPGA (or other PLD) has been decided upon, there is a need for a way to improve the performance (e.g., speed, power consumption, clock skew) of the FPGA that does not involve substantially redesigning the chip.

BRIEF SUMMARY OF THE INVENTION

The present invention provides a method of making an integrated circuit (IC). The method includes establishing an initial design for a programmable logic device (PLD) to be included in the IC that includes programmable connections that can be programmed to implement a desired function; establishing an underlying physical template for the IC wherein at least a portion of the template is based on the initial design for the PLD; selecting a specific configuration of the programmable connections in the PLD; performing a manufacturing process of the IC using the underlying physical template; and, during the manufacturing process of the IC, bypassing selected on-state transistors in the PLD used to implement the specific configuration of the programmable connections with metal connections while conserving the underlying physical template. The method is particularly advantageous in the scenario where the PLD comprises a field-programmable gate array (FPGA).

The present invention also provides an IC. The IC includes a semiconductor substrate and a PLD fabricated on the semiconductor substrate. The PLD has a final design that is based on an initial design contemplated by at least a portion of an underlying physical template used for making the IC. The initial design includes programmable connections that can be programmed to implement a desired function, and the final design implements a specific configuration of the programmable connections of the initial design. The PLD includes a plurality of transistors configured to implement the programmable connections of the initial design, and metal connections configured to bypass selected ones of the plurality of transistors as part of implementing the final design. The IC is particularly advantageous in the scenario where the PLD comprises an FPGA.

A better understanding of the features and advantages of the present invention will be obtained by reference to the following detailed description of the invention and accompanying drawings which set forth an illustrative embodiment in which the principles of the invention are utilized.

BRIEF DESCRIPTION OF THE DRAWINGS

FIG. 2 is a block diagram illustrating an FPGA manufactured in accordance with the present invention.

FIG. 5 is a block diagram illustrating a system on a chip (SOC) manufactured in accordance with the present invention.

FIGS. 10, 11, 12A and 12B are schematic diagrams illustrating methods of bypassing a selection circuit in accordance with the present invention.

DETAILED DESCRIPTION OF THE INVENTION

The present invention teaches a method of efficiently manufacturing a field-programmable gate array (FPGA) such that it has improved performance in terms of speed, power consumption and clock skew. The method of the present invention does not involve the type of substantial redesigning that is involved in manufacturing the ASIC 22 described above. Once a specific configuration for a FPGA is selected, the method of the present invention allows the FPGA to be manufactured in accordance with that specific configuration very quickly, i.e., much quicker than manufacturing the ASIC 22. And the resulting FPGA will operate faster, use less power, and have improved clock skew over a conventionally programmed FPGA. One trade-off of the present invention, which as will be discussed below is actually an advantage, is that the resulting FPGA will have substantially the same physical size as a FPGA manufactured and programmed by conventional methods.

Figure 1:
FIG. 1 is a block diagram illustrating a conventional FPGA and a conventional ASIC.
Figure 3:
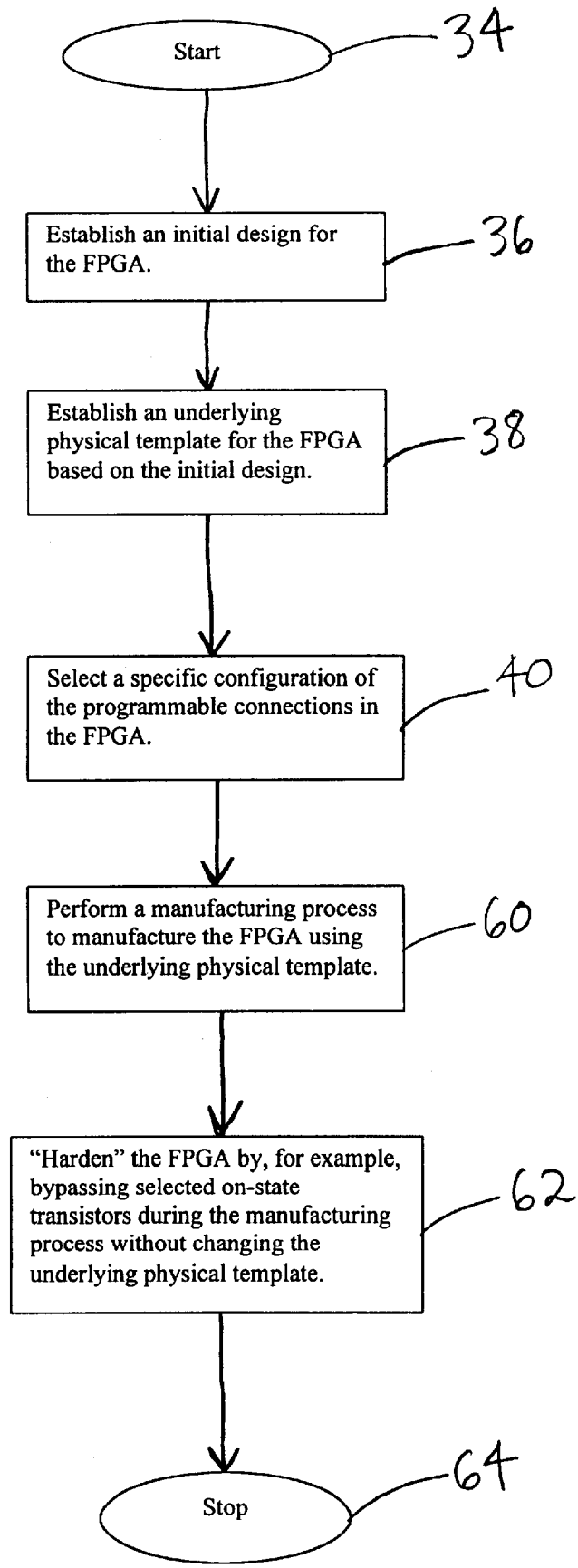
FIGS. 3 and 4 are flow diagrams illustrating processes of making the FPGA shown in FIG. 2 in accordance with the present invention.

Referring to FIGS. 1 and 2, there is illustrated a method of making an FPGA in accordance with the present invention. FPGAs are typically considered to be one type of programmable logic device (PLD). As used herein, the term PLD is meant to encompass all types of programmable logic devices, a few of which include mask-programmable PLDs, field-programmable PLDs, programmable logic arrays (PLAs), FPGAs, etc. Furthermore, as will be discussed below, the present invention also teaches a method of making an integrated circuit (IC), such as a system on a chip (SOC), that includes an embedded FPGA.

The teachings of the present invention may be used to transform the FPGA 30 into the "hardened" FPGA 32. The concept of "hardening" will be discussed in detail below, but in short, such "hardening" increases the speed of a circuit implemented in FPGA technology (or other PLD technology) by bypassing selected on-state switches with fast metal connections and by removing selected off-state switches.

A method of making the hardened FPGA 32 in accordance with the present invention begins at start block 34. In step 36 a circuit schematic, or initial design, for the FPGA 30 is established. The circuit schematic represents the initial design of the FPGA 30. The initial design generally includes programmable connections that can be programmed to implement a desired function. These programmable connections include programmable interconnections of the FPGA 30 array, as well as the connections within devices included within the FPGA 30, such as for example, configurable functional blocks, selection circuits, multiplexer circuits, memory cells, look up tables, etc. Programming the FPGA 30 causes not only the programmable interconnections of the FPGA 30 array to be configured, but also causes the connections within devices included within the FPGA 30 to be programmed which ultimately results in lines being coupled together, or not coupled together, due to transistors being turned on and off.

In step 38 an underlying physical template for the FPGA 30 is established. This template contemplates the initial design of the FPGA 30. If the FPGA 32 is to be embedded into a larger IC, then an underlying physical template for the entire IC is established and at least a portion of the template is based on the circuit schematic for the FPGA 30.

In step 40, a specific configuration of the programmable connections in the FPGA 30 is selected. This will be the specific configuration of the programmable connections in the hardened FPGA 32. A detailed process for selecting the specific configuration will be discussed below.

In step 60, a manufacturing process of the FPGA 32, or the larger IC that will have the FPGA 32 embedded therein, is performed using the underlying physical template. During this manufacturing process, the FPGA 32 is hardened by, for example, bypassing selected on-state transistor switches in the FPGA that are used to implement the specific configuration of the programmable connections. This is shown in step 62. The selected on-state transistor switches are bypassed with metal connections. One advantage of this hardening process is that the underlying physical template is conserved, i.e., it is not changed. This hardening process results in the final design of the FPGA 32. The method ends at block 64.

The metal connections that are used to bypass the selected on-state transistor switches are established during the wafer manufacturing process. The metal connections are preferably established using only one or two layers of masks. Even more preferable, the metal connections are established by depositing them on the top metal layer. As such, establishing the metal connections does not change the underlying physical template of the FPGA body. Instead, the underlying physical template is conserved. Because the underlying physical template is conserved, the hardened FPGA 32 is the same physical size as the FPGA 30. The resulting hardened FPGA 32 is a fast, power conserving, but no longer flexible, implementation of the FPGA 30 having the selected specific configuration of the programmable connections.

The hardened FPGA 32, with its final design, will typically not be used to implement any other functions, but it implements the function of the selected specific configuration with much increased speed. The increase in speed is due to the elimination of delay to propagate signals through the on-state transistor switches and the loading of off-state transistor switches. This also decreases power consumption and improves the clock skew within the device. Therefore, some advantages of the present invention include (1) the bypassing of on-state switches with fast metal connections, and (2) the conservation of the underlying physical template of the FPGA with substantially no reduction of silicon area.

Figure 4:
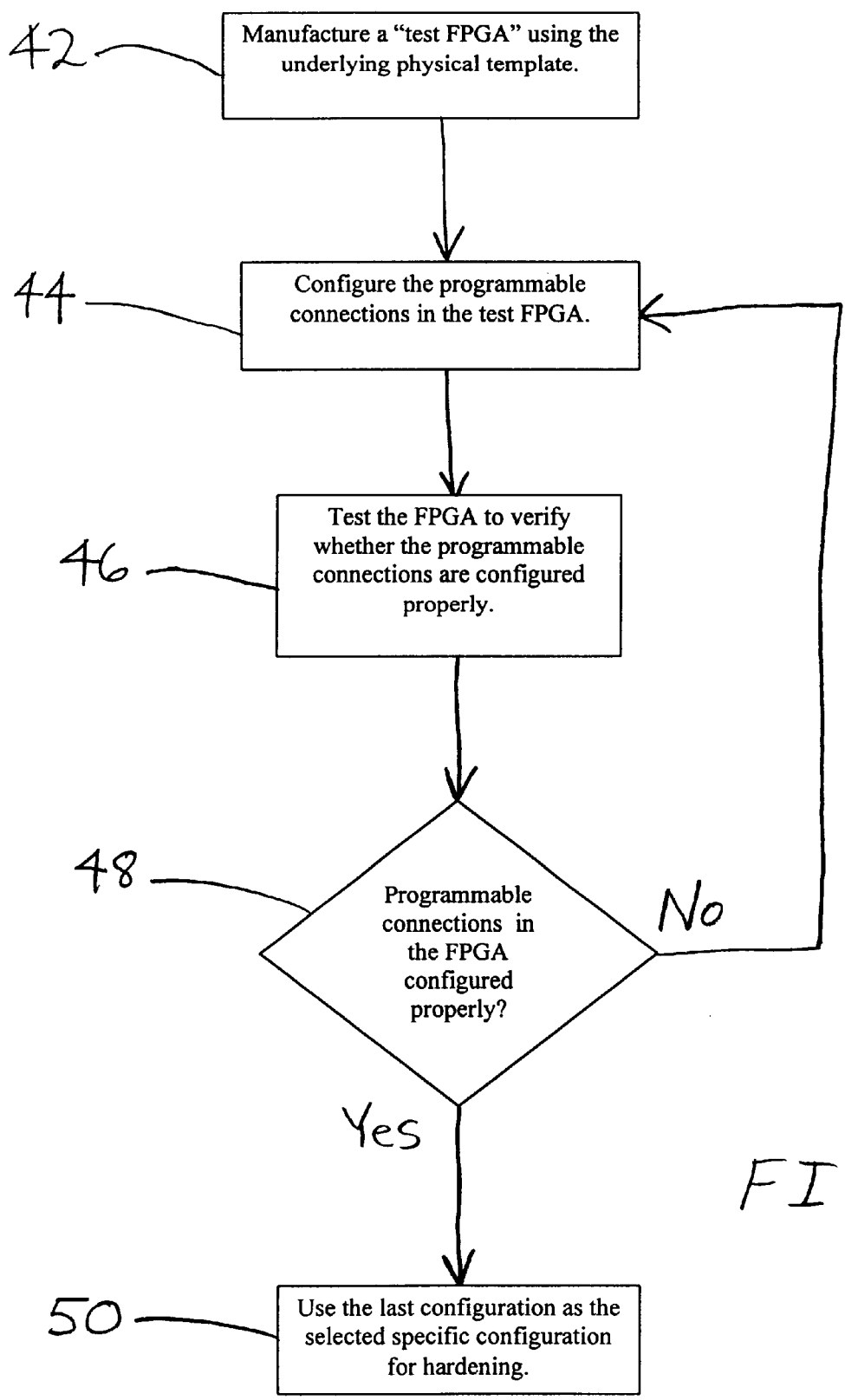

Referring to FIG. 4, there is illustrated a process in accordance with the present invention for selecting the specific configuration that is selected in step 40 described above. Specifically, in step 42 a "test" FPGA is manufactured using the underlying physical template such that the test FPGA includes programmable connections. In step 44 the programmable connections in the test FPGA are configured in the conventional manner, such as for example, with a field programming unit. In step 46 the test FPGA is tested to verify whether the programmable connections are configured properly, and in step 48 it is determined whether or not the programmable connections are configured properly. If the programmable connections are not configured properly, then the programmable connections are reconfigured in step 44. If the programmable connections are configured properly, then in step 50 that configuration is used as the selected specific configuration for hardening.

At least part of the process shown in FIG. 4 will often be performed by a customer, but does not have to be. Specifically, a manufacturer of FPGAs typically manufactures and provides FPGAs to customers. The customer will generally be the one who selects the specific configuration of the programmable connections because he or she is the one who will use the FPGA. The FPGA will typically be used in the customer's product. According to one aspect of the present invention, a manufacture provides a conventionally manufactured and designed FPGA (or other PLD) to a customer. The customer programs and reprograms this "test" FPGA with a field programming unit many times and tests the device to verify the correctness of a specific configuration of the programmable connections. This specific configuration is used by the customer to implement a custom function. Once the specific configuration is verified and committed, the customer provides the specific configuration to the manufacturer. The manufacturer then manufactures additional FPGAs and hardens them with the specific configuration. This manufacturing is performed by processing the uncut FPGA wafer to add the necessary metal connections to connect the source and drain points of the on-state transistor switches. The metal connections are preferably added during the final or near final mask steps of the manufacturing process. The resulting FPGA wafers are thus customized to implement a specific function with increased speed.

As mentioned above, the present invention teaches a method of making an IC, such as a system on a chip (SOC), that includes an embedded FPGA. Referring to FIG. 5, an SOC 70 may include, for example, several components 72, 74, 76, 78, and an embedded FPGA 80. The several components 72, 74, 76, 78 may comprise, for example, a microprocessor, memory, arithmetic logic unit (ALU), state machine, etc. As can be seen, the embedded FPGA 80 is only a small part of the whole SOC 70 chip. The FPGA 80 may also be spread across one or more FPGA regions within the SOC 70.

The teachings of the present invention are particularly useful where the FPGA is embedded in a larger IC, such as the SOC 70. This is because by using the manufacturing process described above, an SOC 82 can be manufactured having a "hardened" embedded FPGA 84 without having to retool or redesign the several components 72, 74, 76, 78. In other words, the several components 72, 74, 76, 78 have not been changed in going from the SOC 70 to the SOC 82. Their original designs have been left intact, i.e., conserved. Yet, the hardened embedded FPGA 84 is a much faster, less power consuming device than the embedded FPGA 80. Thus, the overall performance of the SOC 70 has been improved by hardening the FPGA 84 in accordance with the teachings described above and not redesigning the entire chip. This is a significant advantage of the present invention because it is normally not justifiable to redesign the whole chip just to speed up the FPGA 80.

Figure 6:
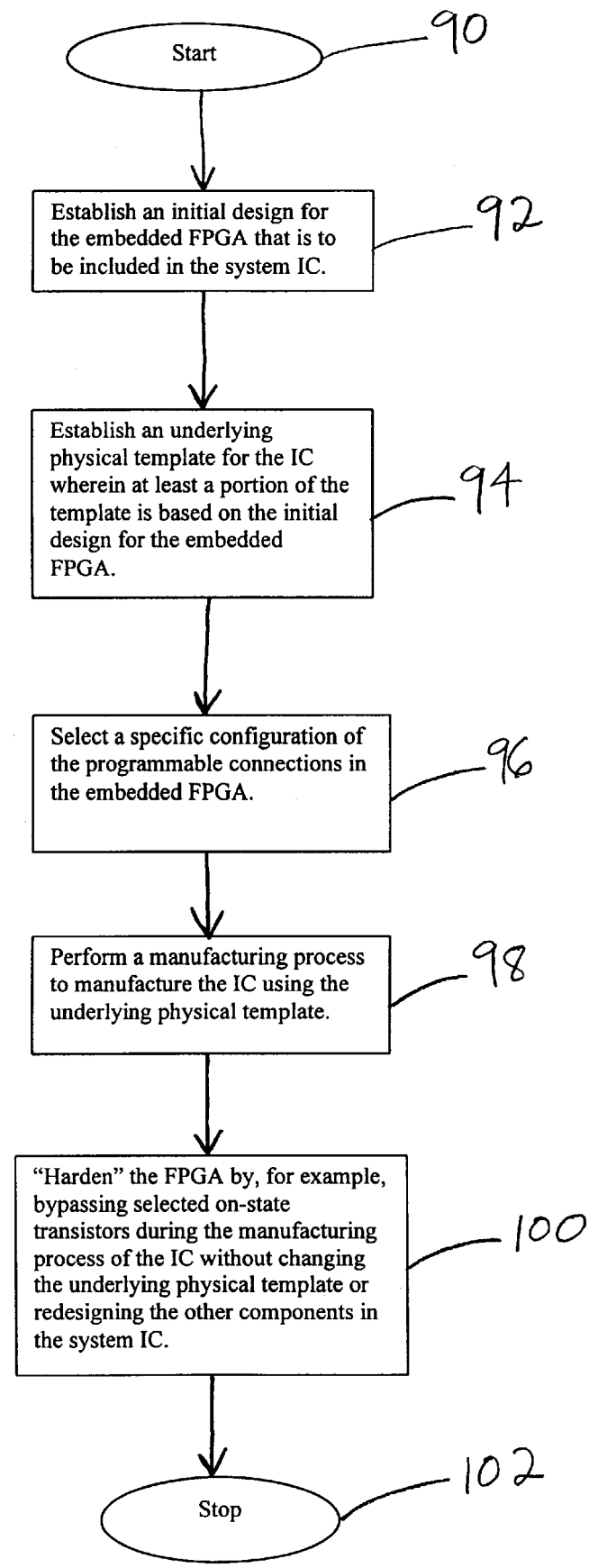
FIG. 6 is a flow diagram illustrating a process of making the SOC shown in FIG. in accordance with the present invention.

Referring to FIG. 6, there is illustrated a process flow in accordance with the present invention which may be used to manufacture a system IC, such as the SOC 82. The process begins in block 90. In step 92, a circuit schematic, or initial design, for the embedded FPGA is established that is to be included in the system IC. In step 94 an underlying physical template for the system IC is established. At least a portion of the template is based on the initial design for the embedded FPGA. In step 96 a specific configuration of the programmable connections in the embedded FPGA is selected. In step 98, a manufacturing process is performed to manufacture the IC using the underlying physical template. Finally, in step 100 the FPGA is "hardened" by, for example, bypassing selected on-state transistors during the manufacturing process of the IC without changing the underlying physical template and without redesigning the other components in the system IC.

One reason that the other components 72–78 in the system IC do not need to be redesigned is because the underlying physical template is not changed, i.e., it is conserved. Because the underlying physical template is not changed, the size of the resulting hardened embedded FPGA 84 is the same as the size of the original embedded FPGA 80. Keeping the FPGA 84 the same size as the FPGA 80 is another reason that the other components 72–78 in the system IC do not need to be redesigned. Thus, it is actually an advantage of the present invention that the method of making the FPGA does not reduce its size. This is because in the scenario where the FPGA is embedded in a larger IC, the other components in the IC are not disturbed by a change of size of the FPGA.

Similar to as is described above with respect to FIG. 4, a customer who is purchasing the resulting SOC 82 will normally select the specific configuration of the programmable connections of the embedded FPGA 84. The manufacture will normally provide a "test" version of the SOC 70 to the customer who will program the embedded FPGA 80 and test it many times until finalizing a specific configuration. The customer will then provide the specific configuration to the manufacturer who will then manufacture the SOC 82 with the hardened embedded FPGA 84.

Figure 7A:
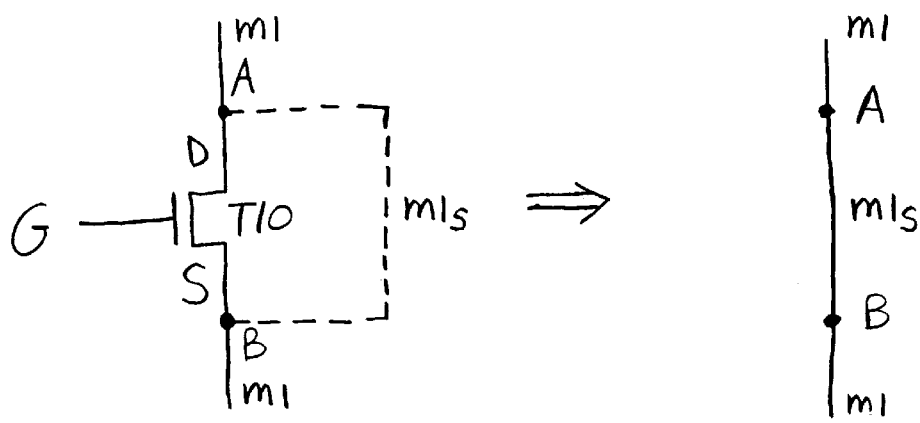
FIGS. 7A, 7B and 7C are schematic diagrams illustrating a method of bypassing a transistor in accordance with the present invention.
Figure 7B:
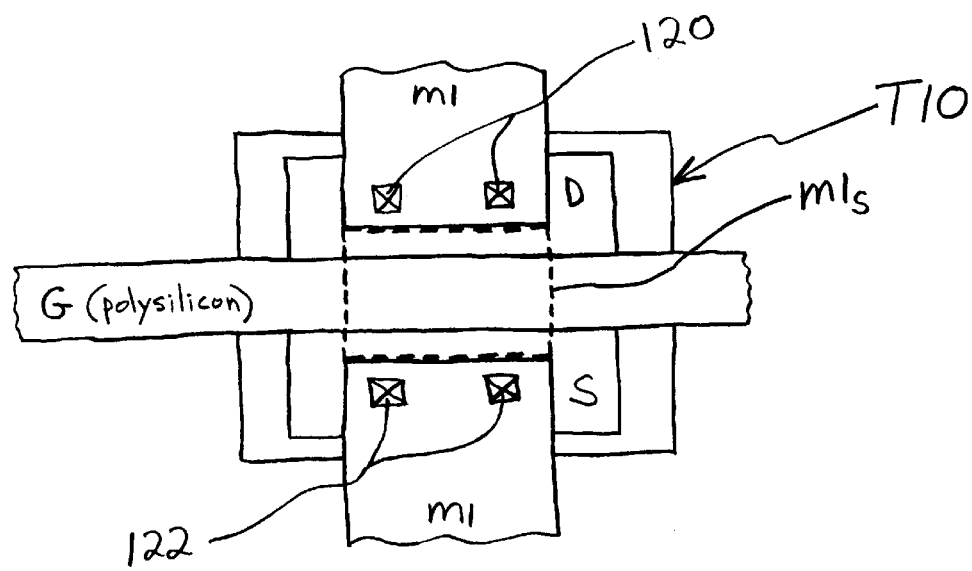
Figure 7C:
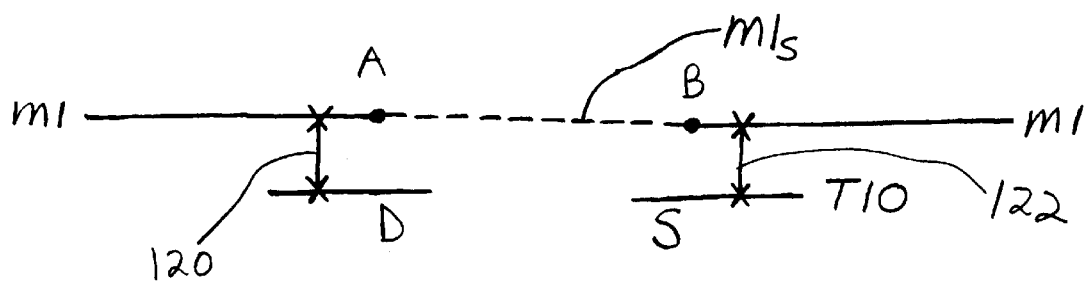

The concept of "hardening" an FPGA (or other PLD) will now be discussed in detail. As mentioned above, hardening involves bypassing selected on-state transistor switches with fast metal connections. Referring to FIGS. 7A, 7B and 7C, an off-state transistor switch represents a very large resistance, and thus, points A and B are disconnected for practical purposes. An on-state transistor switch represents a small resistance between points A and B. For example, the on-state resistance can range from several hundred ohms to a few thousand ohms. When propagating a signal from point A to point B through an on-state transistor switch, the signal delay is largely incurred due to the on-resistance of the switch.

One aspect of The present invention focuses on the removal of the on-state resistance, or at least minimizing it, for example down to less than 5 ohms, of on-state transistor switches. By connecting point A and point B of an on-state switch through a metal wire, the on-state resistance of the switch can be eliminated or substantially eliminated. This is illustrated in FIG. 7A where transistor T10 is bypassed, or shorted, by metal deposition $m1_S$ in metal layer m1 which couples the source and drain of transistor T10 together. By bypassing transistor T10 with metal deposition $m1_S$, the on-state resistance of transistor T10 is eliminated or substantially eliminated. When this is done to many hundreds or thousands of transistors in an FPGA, the speed of the device is substantially increased due to the faster connections. Moreover, the power consumption of the device is decreased due to the lower resistances of the connections.

There are two general ways to make the connection between the source and drain terminals of a transistor during a semiconductor manufacturing process. First, one can "program the metal" meaning that metal is deposited during the manufacturing process on a selected metal layer. The deposited metal is extra metal that is used to connect the selected nodes and has the effect of connecting the source and drain together. This is a horizontal connection. Second, one can "program the hole" meaning that different metal layers are connected together with "via" hole connections, or the first metal layer m1 is connected to the transistor diffusion with a "contact". The idea is to connect different layers of metal together that cause the selected nodes to be connected and ultimately cause the source and drain of the transistor to be connected together. This is a vertical connection. These two methods can be used together or separately and provide many, many options for connecting the two nodes of the transistor. The nodes can be connected using many different metal layers.

FIGS. 7B and 7C illustrates the manner in which metal deposition $m1_S$ s is deposited on the structure of transistor T10 to connect the source and drain, and thus connect points A and B. This is a horizontal connection in the first metal layer m1. The first metal layer m1 is connected to the transistor T10 diffusion by way of contacts 120, 122.

Making the connection using the first metal layer m1 is simple but is not as desirable as using higher metal layers. This is because making the connection using the first metal layer m1 must be performed early in the manufacturing process and it is preferable to delay such connections until the very end of the manufacturing process, i.e., when the last or second to last metal layer is being applied. This way, the manufacturing of the FPGA can be nearly finished before a commitment must be made to a specific configuration of the programmable connections. When a specific configuration is finalized, the FPGA can be quickly hardened in the last step, which improves the time-to-market. Therefore, while the connection can be done in any layer of the metal (or one or more layers), the top metal layer is preferred.

Figure 8A:
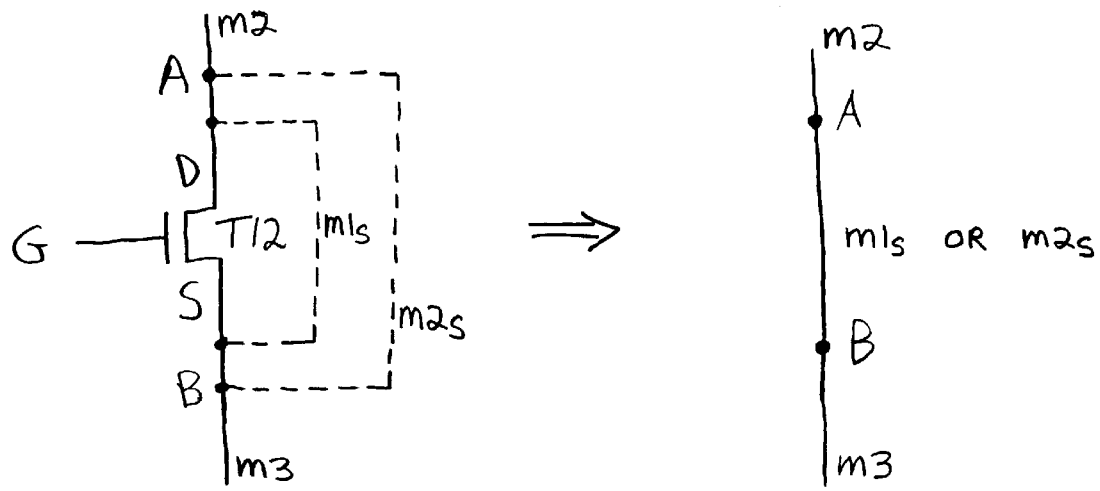
FIGS. 8A, 8B and 8C are schematic diagrams illustrating additional methods of bypassing a transistor in accordance with the present invention.
Figure 8B:
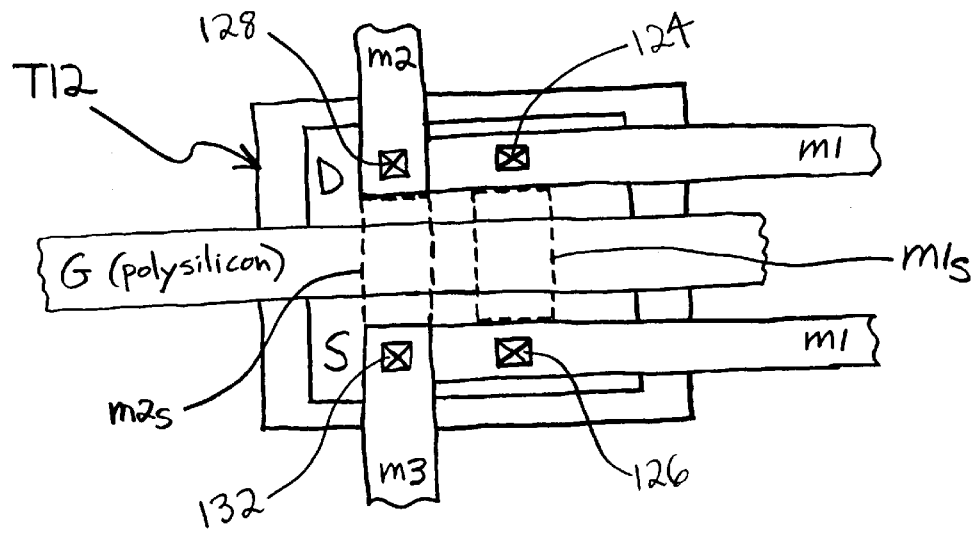
Figure 8C:
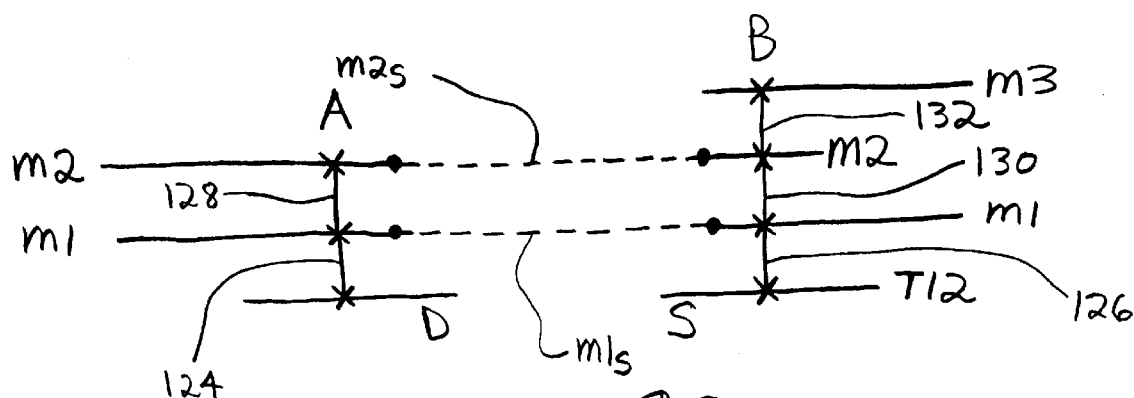

Referring to FIGS. 8A, 8B and 8C, there is an illustration of the use of multiple metal layers to make the connection between points A and B. and thus, bypass transistor T12. Specifically, points A and B can be connected by the use of either metal deposition $m1_S$ or metal deposition $m2_S$. For example, suppose the goal is to provide a fast metal connection between metal layer m3 at point B and metal layer m2 at point A. Normally these two points can be connected only by turning on transistor switch T12. Specifically, metal layer m3 is connected to metal layer m2 by means of via hole connection 132, metal layer m2 is connected to metal layer m1 by means of via hole connections 128, 130, and metal layer m1 is connected to the transistor T12 diffusions by means of contacts 124, 126. When transistor T12 is turned on, metal layer m3 at point B is connected to metal layer m2 at point A.

By depositing metal deposition $m1_S$, metal layer m3 at point B is directly connected to metal layer m2 at point A by means of via connections 132, 130, metal deposition $m1_S$, and via connection 128. Thus, transistor T12 is completely bypassed. Alternatively, by depositing metal deposition $m2_S$, metal layer m3 at point B is directly connected to metal layer m2 at point A by means of via connection 132 and metal deposition $m2_S$. In both of these scenarios, the source and drain of transistor T12 are connected together because the transistor T12 diffusions are connected to metal layer m1 by means of contacts 124, 126, and metal layer m1 is connected to metal layer m2 by means of via hole connections 128, 130.

In the scenario shown in FIGS. 8A–8C, contacts 124, 126 and via hole connections 128, 130, 132 already exist in the chip structure. Transistor T12 can be bypassed in only one step, i.e., by programming either metal deposition m1$_S$ or m2$_S$. This is an example a horizontal connection being used to bypass transistor T12. The vertical connections, i.e., contacts 124, 126 and via hole connections 128, 130, 132, are already in place.

Figure 9A:
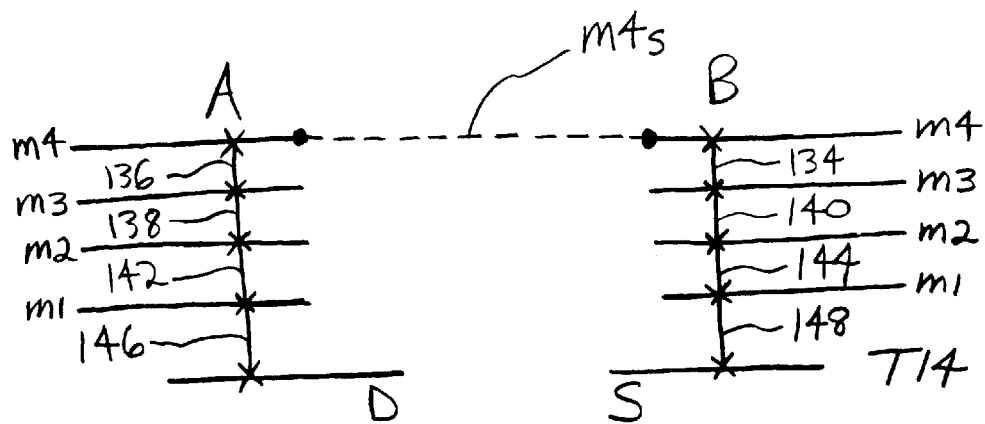
FIGS. 9A and 9B are schematic diagrams illustrating additional methods of bypassing a transistor in accordance with the present invention.
Figure 9B:
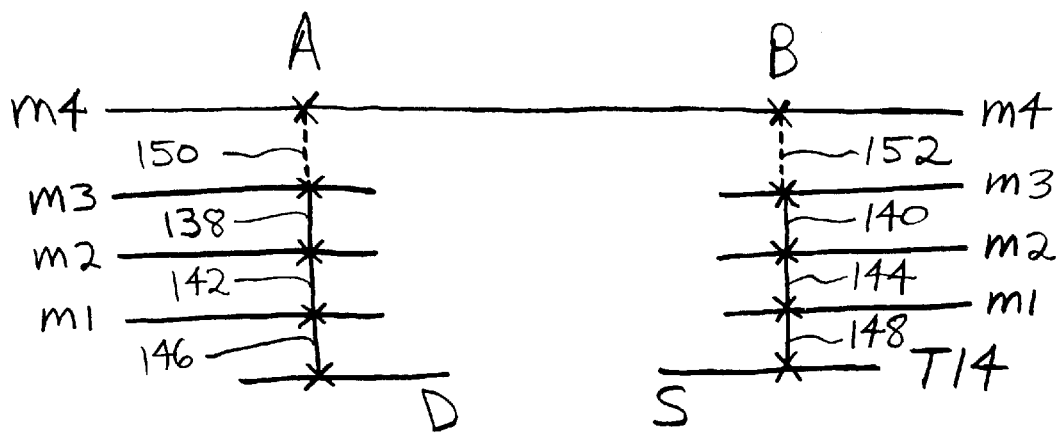

Referring to FIGS. 9A and 9B, the difference between horizontal connections and vertical connections will be illustrated. FIG. 9A illustrates a scenario similar to FIGS. 7A–7C and 8A–8C, i.e., transistor T14 is bypassed by a horizontal connection. Specifically, if point A of any of metal layers m1–m4 is to be connected to point B of any of metal layers m1–m4 by way of a fast metal connection, such connection can be made by depositing metal layer deposition m4$_S$, or such connection can be made by depositing any one of metal layer depositions m1$_S$, m2$_S$, or m3$_S$ (not shown). This is because metal layers m1, m2, m3, m4 at point A are already connected by means of via hole connections 136, 138, 142, and metal layers m1, m2, m3, m4 at point B are already connected by means of via hole connections 134, 140, 144. Thus, transistor T14 can be bypassed by programming any one of metal layer depositions m1$_S$, m2$_S$, m3$_S$, m4$_S$, but it is preferable to bypass it with metal layer deposition m4$_S$ because that is the top layer.

FIG. 9B, on the other hand, illustrates how transistor T14 can be bypassed by using vertical connections. Suppose, for example, that point A of metal layer m2 is to be connected to point B of metal layer m1 by way of a fast metal connection. Furthermore, assume that metal layer m4 is a continuous piece of metal such that points A and B on metal layer m4 are already connected and that via hole connections 138, 140, 142, 144 and contacts 146, 148 have already been placed. In this scenario there are initially no connections between metal layer m4 and any other metal layer.

Point A of metal layer m2 is normally coupled to point B of metal layer m1 by turning on transistor T14. This is because current will flow through via hole connection 142, contact 146, transistor T14, and contact 148 when transistor T14 is turned on. On the other hand, point A of metal layer m2 can be easily connected to point B of metal layer m1 by a fast metal connection simply by programming the via hole connections 150, 152. This is because point A of metal layer m2 becomes connected to point B of metal layer m1 by means of via hole connections 138, 150, metal layer m4, and via hole connections 152, 140, 144. Thus, this is an example of how vertical connection programming can be used to bypass transistor T14. It will be appreciated that any combination of via hole connections 138, 150, 152, 140, 144, could initially be left open and then programmed to be connected near the end of the manufacturing process in order to make the connection in this particular scenario. It is preferable, however, to wait until as close to the end of the manufacturing process as possible to make the connection, and therefore, programming via hole connections 150, 152 to make the connection is preferred.

Thus, in order to bypass transistors by using horizontal connections, certain via hole connections are predeposited and then the metal deposits are programmed later. In order to bypass transistors by using vertical connections, certain metal layers are predeposited and then the via holes are programmed later. Furthermore, it is preferable to wait until the last possible step to make the connection. This is usually done by depositing the top level metal to make the connection. In this scenario, the via holes are already there, and the last step is to make a deposit to connect some portions of the last metal layer, i.e., the top metal layer. Bypassing transistors by using horizontal connections requires the fewest number of steps because programming vertical via hole connections requires a new via mask.

The teachings of the present invention can also be used to provide fast metal connections with respect to multiplexers and other selection circuits. Referring to FIG. 10, transistors T16, T18, T20 and T22 are used to connect one of the signals 0, 1, 2, N to metal layer m3, which in turn, provides the selected signal to circuit 160. Suppose, for example, that in the selected specific configuration for the FPGA, signal 1 is to be connected to metal layer m3 by turning on transistor T18. Transistor T18 can be bypassed, and the connection speeded up, by programming a via hole connection 162. Such is possible because signal 1 is carried by metal layer m2 which is below metal layer m3. Thus, the portion of metal layer m2 that carries signal 1 is vertically connected to metal layer m3 to bypass transistor T18.

FIG. 11 illustrates that the particular type of selection circuit or multiplexer found in the FPGA can vary. In the scenario shown in FIG. 11, any type of selection circuit 164 can be a used to select one of signals 1, 2, 3, N and provide that selected signal to the circuit 168 by way of the metal layer m3. Once a specific signal has been decided upon in the selected specific configuration of the FPGA, the selection circuit 164 can be bypassed by a fast metal connection. In the example shown in FIG. 11, selected signal 2 is connected directly to metal layer m3 by means of programming the via hole connection 166. In this scenario, the via hole connection 166 is used to bypass whatever transistors are included in the selection circuit 164 for coupling signal 2 to the circuit 168.

FIGS. 12A and 12B illustrate how a horizontal connection can be used to bypass the selection circuit 164. Specifically, several short sections 178, 180, 182, 184 of metal layer m3 are predeposited on top of each section of metal layer m2 carrying one of the signals 0, 1, 2, N. These short sections 178., 180, 182, 184 of metal layer m3 are connected to the lower metal layer m2 by means of via hole connections 170, 172, 174, 176, respectively. If the selection circuit 164 is to be used, then metal deposition layer m3$_{S1}$ can be deposited to make the connection between selection circuit 164 and circuit 168.

Once a specific signal has been selected in the selected specific configuration for the FPGA, two additional short sections of metal layer m3 may be deposited to make a fast metal connection in order to bypass selection circuit 164. For example, assume signal 2 is the selected signal. Metal deposition layer m3$_{S2}$ can be deposited to make a connection between metal section 182 and metal layer m3, and metal deposition layer m3$_{S3}$ can be deposited to make a connection between metal layer m3 and the circuit 168. FIG. 12B is a cross-sectional view showing the metal deposition layer m3$_{S2}$. Thus, whatever transistors are included in the selection circuit 164 for coupling Signal 2 to the circuit 168 have been bypassed with horizontal connections.

The selection circuits and multiplexers described above in FIGS. 10, 11 12A and 12B are considered herein to include programmable connections within an FPGA that can be programmed to help implement a desired function. This is because programming the FPGA causes these devices to also be programmed which ultimately results in lines being coupled together, or not coupled together, due to transistors being turned on and off. Many of the transistors which are programmed and which do the coupling are then bypassed when the device is hardened.

As can be seen in FIGS. 10, 11 12A and 12B, the illustrated metal layer m3 is often provided in the device specifically for the purpose of bypassing the selection circuit at a later stage of the manufacturing process. In general, the spaces needed for depositing extra metal sections to be used for bypassing selected on-state transistors when the device is hardened may be reserved in the design of the FPGA physical template. Or, extra metal may be predeposited and spaces reserved in the design of the FPGA physical template for the later placement of via hole connections. In any event, it is preferable to design the FPGA physical template to accommodate the later hardening of the selected on-state transistors.

Figure 13A:
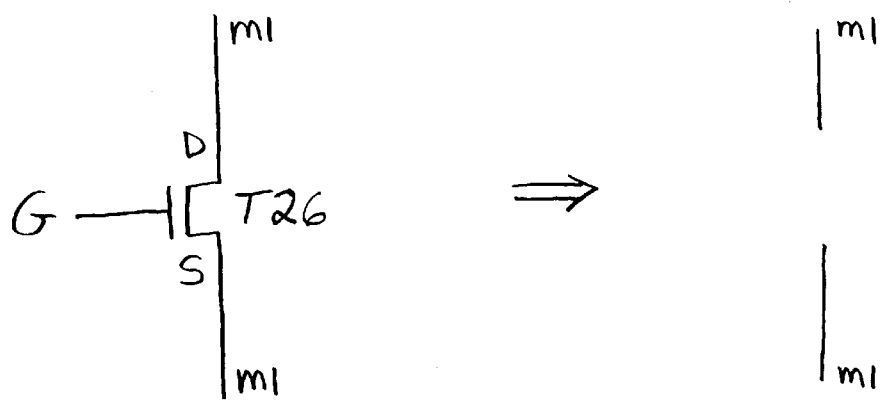
FIGS. 13A, 13B and 13C are schematic diagrams illustrating a method of disconnecting a transistor in accordance with the present invention.
Figure 13B:
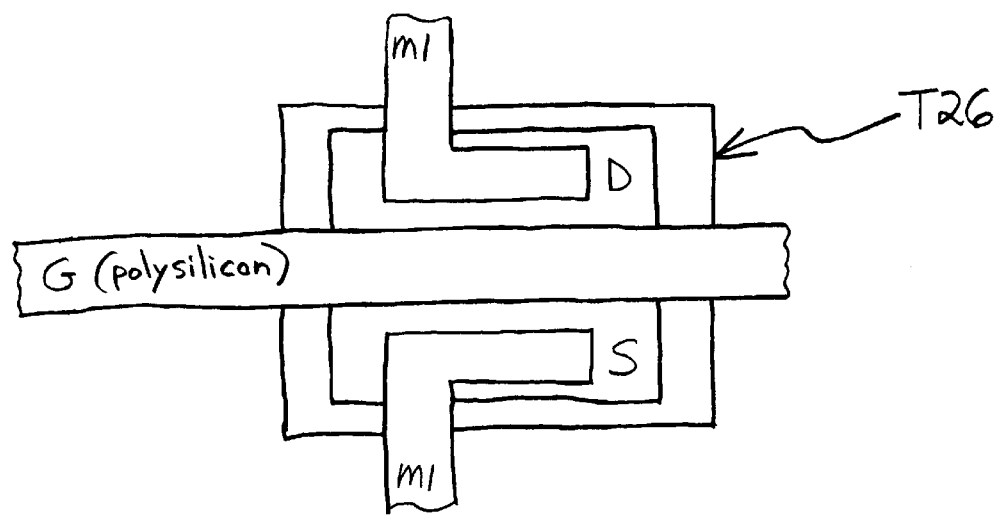
Figure 13C:

Referring to FIGS. 13A, 13B and 13C, it is also desirable to remove contacts of selected off-state transistor switches to speed up the device. Specifically, in the selected specific configuration of the programmable connections of the FPGA, many transistor switches will be left in the off-state. Although these transistors are turned off, their connection to metal layers still causes some capacitive loading on the line. For example, if transistor T26 is connected to metal layer m1, even though it is turned off it still loads metal layer m1. In order to completely remove this loading, transistor T26 can be disconnected (or removed) from metal layer m1. This is done by removing (or deleting) the contacts that connect metal layer m1 to the transistors T26 diffusion. This way, transistor T26 is completely isolated and does not place a capacitive load on any lines.

While it may be advantageous to disconnect an off-state transistor at the contact-diffusion point in order to prevent it from loading any lines, it may not always be practical because this is done at the lowest level in the semiconductor structure. Referring to FIG. 9A, for a example, if transistor T14 was to be in the off-state and one wanted to prevent it from loading metal layer m4, the via hole connections 134, 136 could be removed close to the end of the manufacturing process. This would prevent loading of metal layer m4, but not metal layers m1, m2, m3. Therefore, the disconnection or removal of off-state transistor switches may be done at the top level metal layer by the removal of via hole connections and/or by deleting selected pieces of top level metal.

Figure 14:
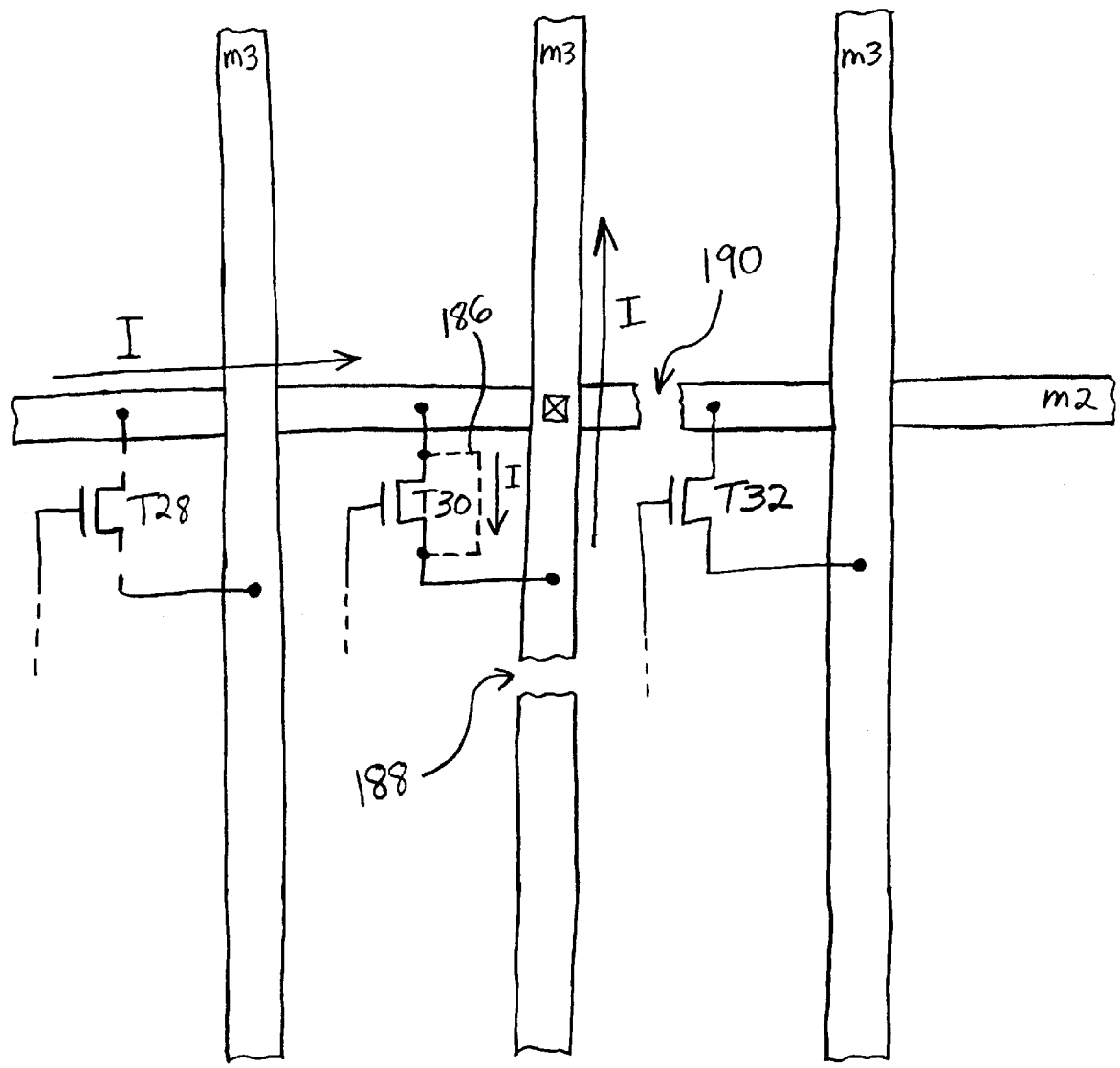
FIG. 14 is a schematic diagram illustrating a method of reducing capacitive loading in accordance with the present invention.

Referring to FIG. 14, there is illustrated additional ways in which capacitive loading on selected signal paths can be reduced when a device is hardened. Specifically, assume that transistor T30 is an on-state transistor that has been bypassed by means of fast metal connection 186 and that the direction of current flow is indicated by arrow I. One way to reduce capacitive loading on this current path is to disconnect transistor T28 as described above. Another way to reduce capacitive loading on this current path is to break metal layer m3 at point 188 and break metal layer m2 at point 190. The current I does not need to flow through these sections of metal to get to its destination. It is advantageous to remove these sections of metal because all they do is add capacitance to the current path.

Figure 15:
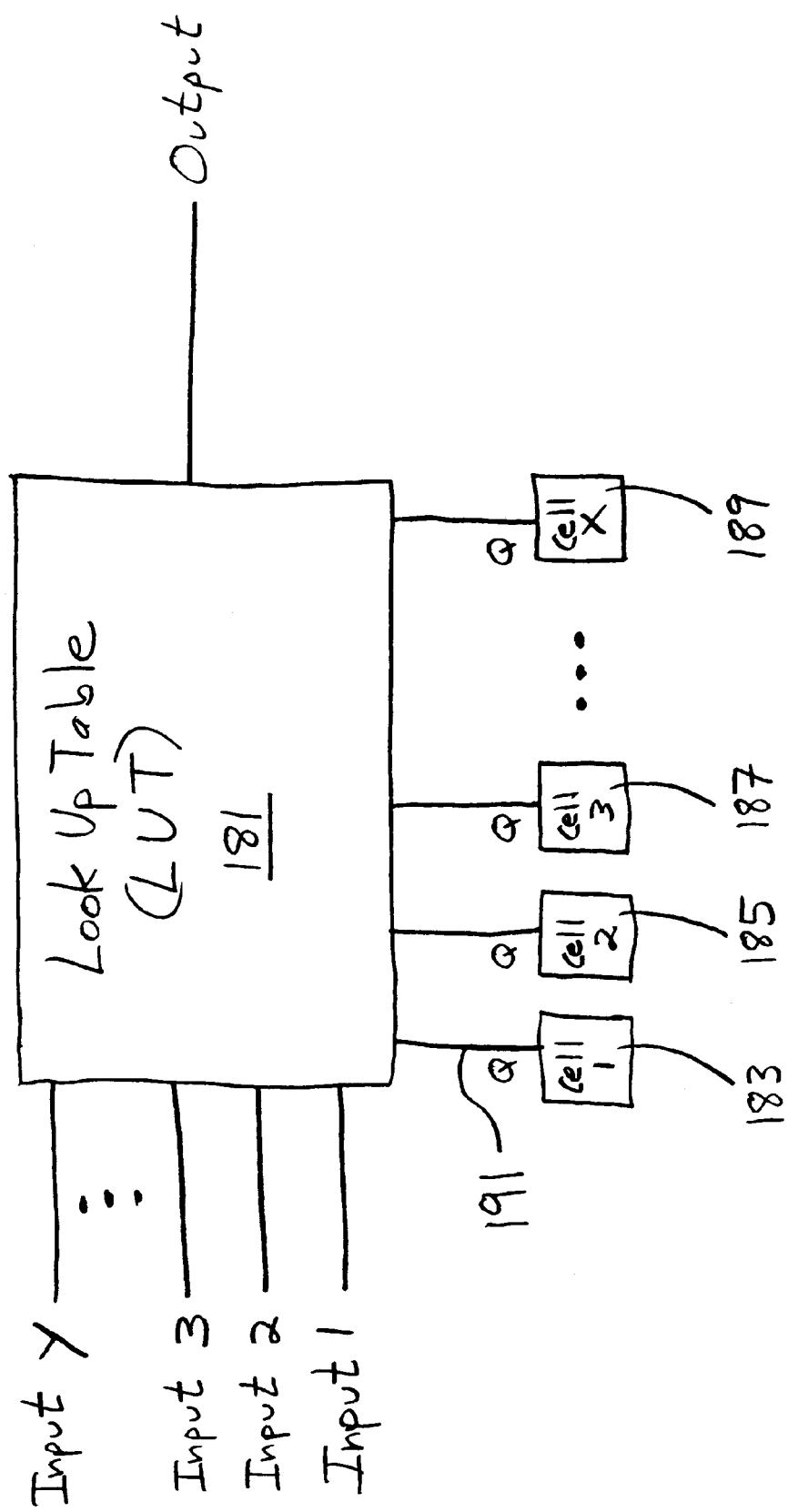
FIGS. 15 and 16 are schematic diagrams illustrating methods of bypassing memory cells in accordance with the present invention.

The teachings of the present invention can also be used to provide fast metal connections within, or to bypass, memory cells. For example, FIG. 15 illustrates a look up table (LUT) 181 having Inputs 1, 2, 3, . . . y, and an Output. The LUT 181 is configured by programming the memory cells 183, 185, 187, . . . 189. Each of the memory cells 183, 185, 187, . . . 189 may be programmed to have a "1" or a "0" on its Q output, and the specific setting of all of the memory cells 183, 185, 187, . . . 189 taken together provides a specific configuration for the LUT 181. Once a specific configuration of the memory cells 183, 185, 187, . . . 189 is decided upon, the settings of the memory cells may be "hardened" in accordance with the present invention.

Figure 16:
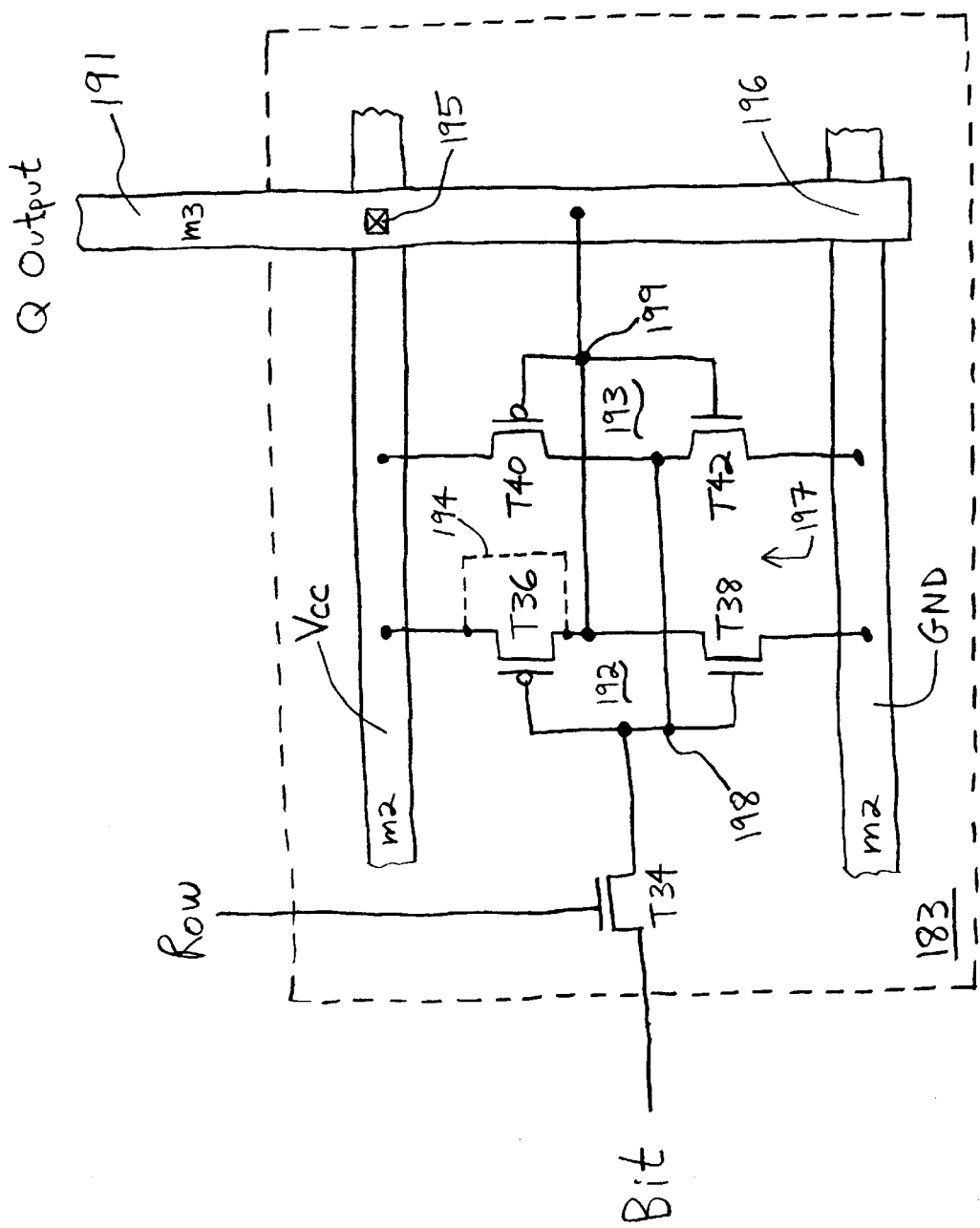

Specifically, memory cell 183 is illustrated in more detail in FIG. 16. In this example, memory cell 183 is a CMOS static random access memory (SRAM) cell, but it should be understood that the teachings of the present invention apply to other types of memory cells and storage devices. Memory cell 183 includes an n-channel pass transistor T34 (or "pass gate") and two inverters 192, 193 connected back-to-back to form a latch 197. The inverter 192 includes a p-channel transistor T36 and an n-channel transistor T38, and the inverter 193 includes a p-channel transistor T40 and an n-channel transistor T42. Pass transistor T34 is used to couple storage node 198 of the latch 197 to the Bit line. Pass transistor T34 is activated, or turned on, by the Row line signal. Storage node 199 of the latch 197 forms the Q output 191 of the memory cell 183. Thus, programmnable connections can be made within the memory cell 183 by way of transistors T34, T36, T38, T40, T42.

In the scenario where memory cell 183 is programmed to have a "1" on the Q output 191, transistor T36 is turned on so that storage node 199 is pulled high to $V_{CC}$. In this scenario there are at least two different ways that the memory cell 183 can be hardened. First, the on-state transistor T36 can be bypassed by means of fast metal connection 194 in accordance with the teachings described above. This will provide fast metal connections from $V_{CC}$ to the Q output 191. Alternatively, due to the configuration of the $V_{CC}$ and ground GND lines being on metal layer m2 lines and the Q output 191 being on a metal layer m3 line, the Q output 191 can be directly connected to $V_{CC}$ by programming a via hole connection 195. This, perhaps, is a more direct way to bypass the memory cell 183 and is considered herein to be one way of bypassing transistor T36. It should be understood that the memory cell 183 could also be bypassed by using horizontal connections such as is described above with respect to FIGS. 12A and 12B.

In the scenario where memory cell 183 is programmed to have a "0" on the Q output 191, transistor T38 is turned on so that storage node 199 is pulled low to ground GND. In this scenario there are also at least two different ways that the memory cell 183 can be hardened. First, the on-state transistor T38 can be bypassed by means of a fast metal connection in accordance with the teachings described above. This will provide fast metal connections from GND to the Q output 191. Alternatively, the Q output 191 can be directly connected to GND by programming a via hole connection at location 196, which is considered herein to be one way of bypassing transistor T38. Or, a horizontal connection from GND to the Q output 191 could be programmed similar to as is described above with respect to FIGS. 12A and 12B.

Therefore, memory cells within an FPGA can be programmed and reprogrammed (i.e., change settings) several times during testing. Such memory cell settings, as well as the selection circuit and multiplexer settings described above, are considered herein to be programmable connections within an FPGA that can be programmed to help implement a desired function. This is because programming the FPGA causes these devices to also be programmed which ultimately results in lines being coupled together or not coupled together due to transistors being turned on and off. Once a specific configuration of the memory cells is selected, the memory cells can be hardened. Such hardening can be done, for example, by connecting the Q output (or Q_B output) to $V_{CC}$ for a "1" or GND for a "0" by using either vertical or horizontal connections to bypass the appropriate traitors.

Figure 17A:
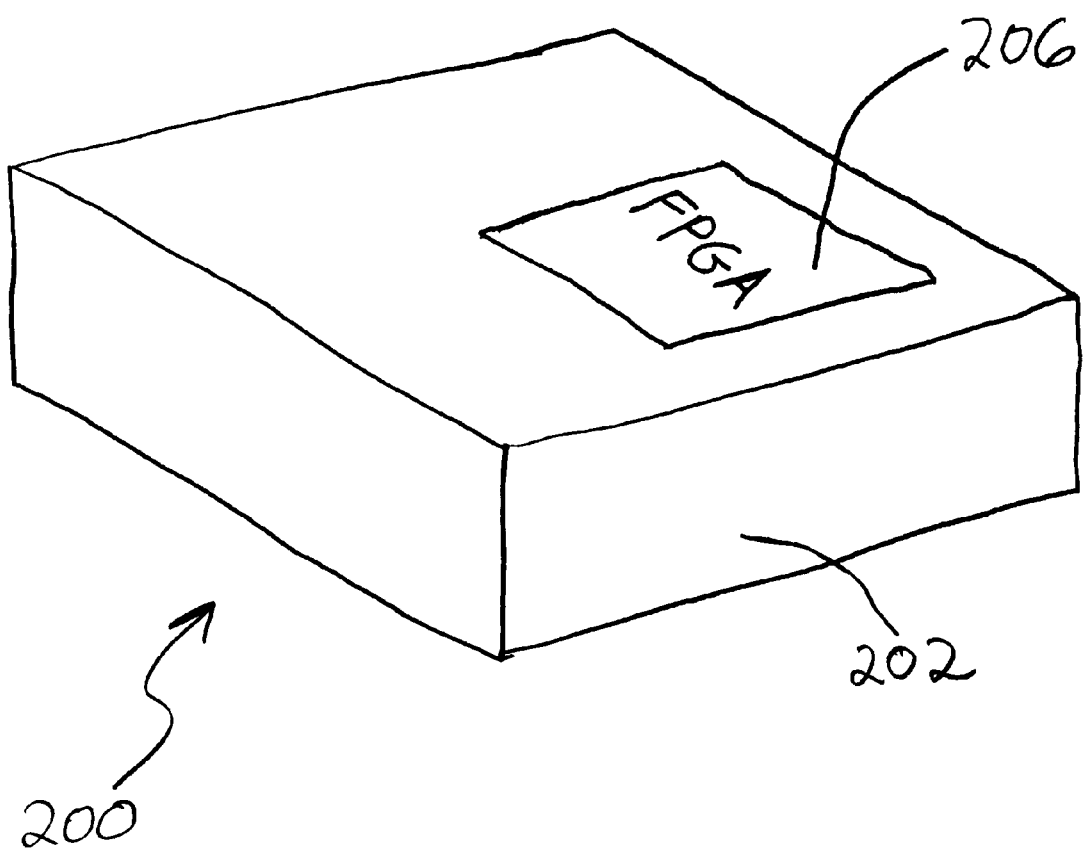
FIG. 17A is an isometric diagram illustrating an integrated circuit in accordance with the present invention.
Figure 17B:
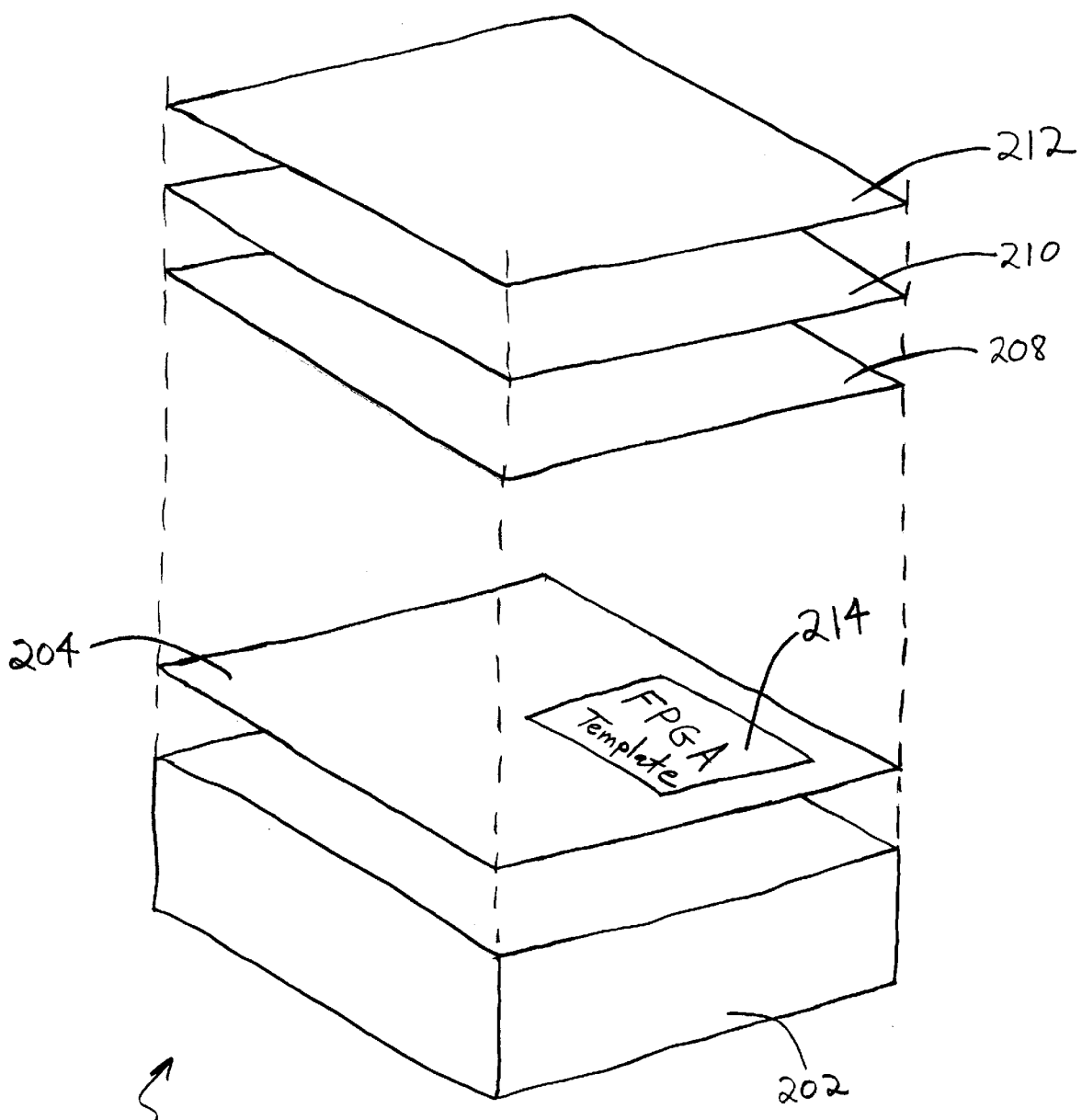
FIG. 17B is an exploded isometric diagram illustrating the integrated circuit shown in FIG. 17A during its manufacture.

Referring to FIG. 17A, there is illustrated an IC 200 in accordance with the present invention, and FIG. 17B illustrates the IC 200 during its manufacture. The IC 200 includes a semiconductor substrate 202 and a FPGA 206 fabricated on the semiconductor substrate 202. It should be well understood that the FPGA 206 may occupy the entire semiconductor substrate 202 or just a portion of it along with other components.

After the manufacturing process, the FPGA 206 will have a final design that is based on an initial design contemplated by at least a portion of the underlying physical template 204 that is used for manufacturing the IC 200. The portion of the underlying physical template 204 that contemplates the initial design of the FPGA is indicated by 214. Specifically, the initial design includes programmable connections that can be programmed to implement a desired function. The final design includes, for example, transistors that have been bypassed, transistors that have been disconnected, and/or selection circuits that have been bypassed, all in accordance with the above teachings. The final design is intended to implement a selected specific configuration of the programmable connections of the initial design. The selected specific configuration may be selected in accordance with the above teachings.

The FPGA 206 includes transistors that are configured to implement the programmable connections of the initial design. During the manufacturing process, at least some of those transistors will be bypassed, and others may be disconnected, as part of implementing the final design. Furthermore, various selection circuits may also be bypassed as part of implementing the final design. This can occur by programming extra metal or via holes in the masks, such as masks 208, 210, 212. Such transistor bypassing will preferably be left until the upper most mask 212, but it may be performed in any mask. The programmed extra metal connections will be used to bypass transistors as described above.

In summary, FPGAs and other PLDs are flexible devices that can be programmed, but because they are flexible, they are not as fast as they could be if implemented in an ASIC. Using the teachings of the present invention, the flexibility of the FPGA or other PLD can initially be taken advantage of by reprogramming and testing the device many times. Then, once a specific configuration is selected, the device is hardened in the final stages of the manufacturing process in order to speed the device up. This hardening results in the final design of the FPGA described above. In general, hardening may be performed by bypassing selected on-state transistors and/or disconnecting selected off-state transistors. Up to only a few mask layers need to be changed in order to bypass on-state transistors. It is preferable to reserve spaces for the extra metal depositions and via holes needed to bypass transistors in the design of the underlying physical template.

The above-discussion focused on the scenario where the switches that are bypassed are implemented with traitors controlled by memory cells. These switches, however, can be implemented in various technologies, such as ONO antifuse, M—M antifuse, SRAM memory cell, Flash EPROM memory cell, and EEPROM memory cell. It should be well understood that the teachings of the present invention can be applied to all of these technologies, including the antifuse scenarios.

It should be understood that various alternatives to the embodiments of the invention described herein may be employed in practicing the invention. It is intended that the following claims define the scope of the invention and that structures and methods within the scope of these claims and their equivalents be covered thereby.

What is claimed is:

1. A method of making an integrated circuit (IC), comprising:

establishing an initial design for a programmable logic device (PLD) to be included in the IC that includes programmable connections that can be programmed to implement a desired function;

establishing an underlying physical template for the IC wherein at least a portion of the template is based on the initial design for the PLD;

selecting a specific configuration of the programmable connections in the PLD;

performing a manufacturing process of the IC using the underlying physical template; and during the manufacturing process of the IC, bypassing selected on-state transistors in the PLD used to implement the specific configuration of the programmable connections with metal connections while conserving the underlying physical template.

2. A method in accordance with claim 1, wherein the IC comprises another component in addition to the PLD.

3. A method in accordance with claim 1, wherein the IC comprises a system on a chip (SOC) and the PLD is embedded therein.

4. A method in accordance with claim 1, wherein the PLD comprises a field-programmable gate array (FPGA).

5. A method in accordance with claim 1, wherein the step of establishing an underlying physical template for the IC comprises:

reserving spaces in the underlying physical manufacturing template for depositing metal connections.

6. A method in accordance with claim 1, wherein the step of selecting a specific configuration of the programmable connections in the PLD comprises:

manufacturing a test IC using the underlying physical template such that the test IC includes a test PLD having programmable connections;

configuring the programmable connections in the test PLD; and testing the test PLD to verify whether the programmable connections are configured properly.

7. A method in accordance with claim 1, wherein the step of bypassing selected on-state transistors in the PLD used to implement the specific configuration of the programmable connections with metal connections comprises:

depositing metal on a metal layer of the IC in order to couple together a source and a drain of one of the selected on-state transistors.

8. A method in accordance with claim 7, wherein the step of depositing metal on a metal layer of the IC comprises:

depositing metal on a top metal layer of the IC.

9. A method in accordance with claim 1, wherein the step of bypassing selected on-state transistors in the PLD used to implement the specific configuration of the programmable connections with metal connections comprises:

making via connections between metal layers of the IC in order to couple together a source and a drain of one of the selected on-state transistors.

10. A method in accordance with claim 1, further comprising:

during the manufacturing process of the IC, disconnecting selected off-state transistors in the PLD that are turned off in the specific configuration of the programmable connections while conserving the underlying physical template.

11. A method in accordance with claim 10, wherein the step of disconnecting selected off-state transistors in the PLD comprises:
   deleting selected pieces of metal on a top level metal layer of the IC.

12. An integrated circuit (IC), comprising:
   a semiconductor substrate;
   a programmable logic device (PLD) fabricated on the semiconductor substrate, the PLD having a final design that is based on an initial design contemplated by at least a portion of an underlying physical template used for making the IC, wherein the initial design includes programmable connections that can be programmed to implement a desired function and wherein the final design implements a specific configuration of the programmable connections of the initial design, wherein the PLD includes,
   a plurality of transistors configured to implement the programmable connections of the initial design; and
   metal connections configured to bypass selected ones of the plurality of transistors as part of implementing the final design.

13. An integrated circuit (IC) in accordance with claim 12, further comprising another component in addition to the PLD) fabricated on the semiconductor substrate.

14. An integrated circuit (IC) in accordance with claim 12, wherein the PLD comprises a field-programmnable gate array (FPGA).

15. An integrated circuit (IC) in accordance with claim 12, wherein PLD comprises a field-programmable gate array (FPGA).

16. An integrated circuit (IC) in accordance with claim 12, wherein the metal connections configured to bypass selected ones of the plurality of transistors comprises:
   deposited metal on a metal layer of the IC that couples together a source and a drain of one of the selected ones of the plurality of transistors.

17. An integrated circuit (IC) in accordance with claim 16, wherein the deposited metal is deposited on a top metal layer of the IC.

18. An integrated circuit (IC) in accordance with claim 12, wherein the metal connections configured to bypass selected ones of the plurality of transistors comprises:
   via connections between metal layers of the IC that couple together a source and a drain of one of the selected ones of the plurality of transistors.

19. An integrated circuit (IC) in accordance with claim 12, wherein selected ones of the plurality of transistors are disconnected by deleting selected.

20. An integrated circuit (IC) in accordance with claim 19, wherein selected ones of the plurality of transistors are disconnected by deleting selected of metal in top level metal layer of the IC.

* * * * *